United States Patent [19]

Rich

[11] Patent Number: 5,065,089

[45] Date of Patent: Nov. 12, 1991

[54] CIRCUIT HANDLER WITH SECTIONED RAIL

[75] Inventor: Donald S. Rich, Long Valley, N.J.

[73] Assignee: Tovex Tech, Inc., Long Valley, N.J.

[21] Appl. No.: 532,253

[22] Filed: Jun. 1, 1990

[51] Int. Cl.⁵ .................. G01R 31/02; B07C 5/344
[52] U.S. Cl. ............................ 324/158 F; 209/573; 324/73.1
[58] Field of Search .............. 324/158 F, 73.1; 209/573; 414/222

[56] References Cited

U.S. PATENT DOCUMENTS

| | | | |
|---|---|---|---|
| 3,701,021 | 10/1972 | Isaac et al. | 324/158 F |
| 3,761,808 | 9/1973 | Ryan | 324/158 F |
| 4,823,480 | 4/1989 | Komatsuzaki | 34/218 |
| 4,897,762 | 1/1990 | Daikoku et al. | 174/16.1 |
| 4,904,153 | 2/1990 | Iwasawa et al. | 98/115.3 |

Primary Examiner—Ernest F. Karlsen
Attorney, Agent, or Firm—Rohm & Monsanto

[57] ABSTRACT

A circuit handler provides a controllable environment for monitoring of an electrical device which is being subjected to a test procedure. The controllable environment may correspond to temperature extreme on the order of $-55°$ C. and $+155°$ C. The circuit handler has a support base with a conditioning input for receiving the conditioning fluid, which may be heated air or super-cooled nitrogen or hydrogen, a control input for receiving pneumatic signals, and a pressurized air input for forming an air curtain which prevents the cold conditioning fluid from forming ice on the transport rails. The mechanical operations within the support base are performed by pneumatic solenoids to avoid the generation of stray magnetic or electrical fields which might interfere with the electrical testing process. Delivery of the conditioning fluid to the test site, and possibly a pre-soak site, is achieved by manifold depressions formed on the underside of a test site portion of the transport rail. Additionally, the air curtain is formed by manifold depressions formed in inlet and outlet rail portions which, in combination with the support base, deliver the pressurized air to the junctions of the test site rail portion.

15 Claims, 4 Drawing Sheets

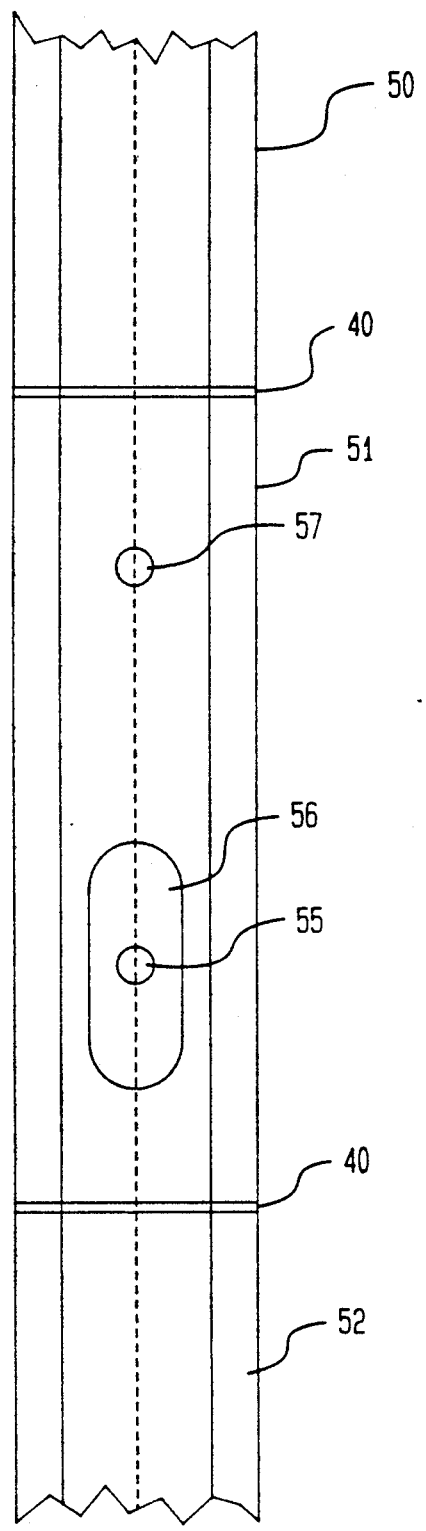
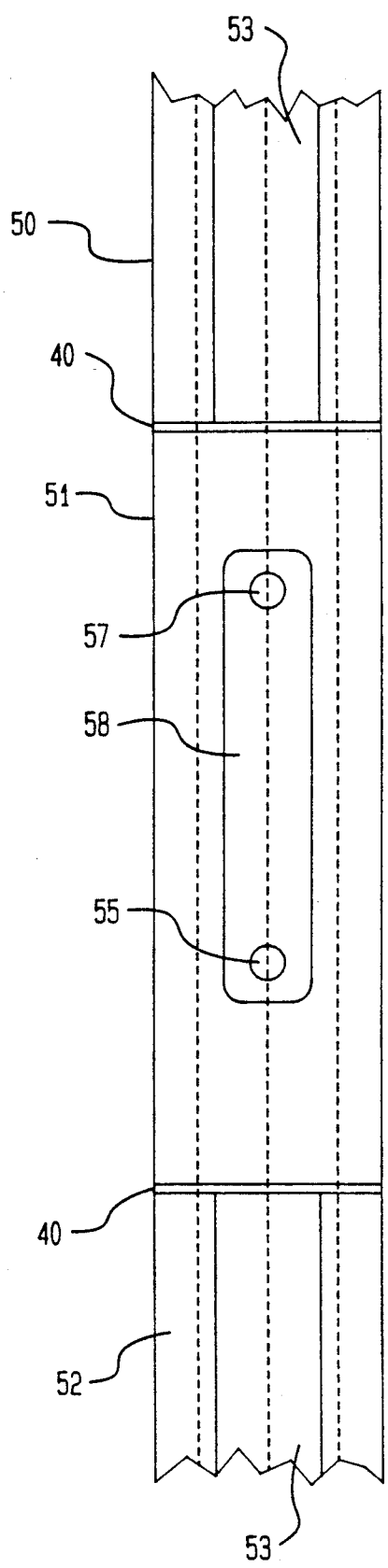

CIRCUIT HANDLER WITH SECTIONED RAIL

BACKGROUND OF THE INVENTION

This invention relates generally to systems and arrangements for handling and testing packaged circuits, such as hybrid and integrated circuits, and more particularly, to a head for a handler having a sectioned rail system.

Integrated circuit and hybrid circuit handling systems have been employed for a number of years to facilitate testing of the devices in controlled environmental conditions, in automatic and semiautomatic modes. Of course, the testing of such electrical devices can be achieved in a manual system, but the throughput would be quite low, typically on the order of one or two units per minute. Fully automatic systems, however, are generally quite large, complex, and expensive. They are not readily adaptable to changes in the design of the circuit packages, but can achieve very high throughput.

There is a need in this industry for a handler arrangement which can achieve throughput rates on the order of a hundred or more electrical devices tested per hour, while achieving low initial cost, simplicity of construction, high modularity for ready adaptability to variations in the physical configuration of the devices to be tested, adaptability to the specific working and testing environment of the user, and compactness.

In order to achieve the appropriate environmental conditions to perform the required tests on the electrical devices to be tested, temperatures are required to range from typically as high as 155° C. to −55° C. In situation where the same handler unit conducts the testing in the cooled and heated modes, it is important that the handler not degrade rapidly as a result of repeated temperature variations. Such repeated wide-ranging temperature swings can impose thermal stresses upon the handler structure in the vicinity of the test site, which may result in a reduction in the life of the handler.

There is a particular problem which is present during cold testing, and which significantly reduces the throughput of a typical handler. Icing of the transport rails occurs when the dried, refrigerated cooling medium is vented from the test site and communicates with the external device transport rails. The external rails are generally at ambient temperature and exposed to the humidity in ambient air. The cold exhaust from the test site will cause the humidity in the air to precipitate as ice on the external rails, which ice eventually accumulates to the point where the electrical devices being tested will not be transportable therealong. There is, therefore, a need for a system which avoids icing on the transport rail.

It is a further problem with known handler systems that the control mechanism which governs the traffic flow and device handling will create stray fields which will affect the test process. Particularly in situations where the electrical device under test is either a low power device or operates at very high frequencies, stray magnetic or electrical fields generated by the control devices in the handler itself will result in erroneous test readings. A further source of potentially damaging electrical fields is the static charges which are developed as the electrical device under test, which may itself be packaged in a polymeric material, slides along the handler's transport rail.

It is, therefore, an object of this invention to provide a simple, economical, and compact handler system for electrical devices such as integrated and hybrid circuits.

It is another object of this invention to provide a handler arrangement which eliminates stray magnetic and electrical fields in the vicinity of the test site.

It is also an object of this invention to provide a handler system which can operate hot and cold testing environments.

It is a further object of this invention to provide a handler system which does not generate static charges and fields.

It is additionally an object of this invention to provide a handler system wherein transport rails external to the test site do not ice up during cold testing.

It is yet a further object of this invention to provide a handler system which achieves high throughout in a gravity feed transport arrangement.

It is still another object of this invention to provide a handler system which is characterized by low effective thermal mass at the test site.

SUMMARY OF THE INVENTION

The foregoing and other objects are achieved by this invention which provides a circuit handler system for providing a controllable environment during monitoring of an electrical device. While the device is in the controllable environment, it is subjected to a test procedure, which may be electrical in nature. In accordance with a system aspect of the invention, the circuit handler is provided with a support base having a first input for receiving a conditioning fluid which produces a predetermined temperature in the controllable environment. The conditioning fluid may be any of several known cooling or heating gases which will control the temperature of the device being tested. The support base is provided with a second input for receiving control signals, and a third input for receiving pressurized air. The second input may be, in certain embodiments, a plurality of pneumatic input ports for receiving pneumatic control signals. The pressurized air received at the third input may be a dried air, which in certain embodiments will be used to produce an air curtain which will prevent communication between the conditioning fluid and other areas of the handler system. The support base is provided with a test output which produces signals responsive to the electrical device while it is under test. As will be described herein, the specific arrangement of the test output may be configured to conform with the user's requirement, and interface directly with the user's test and monitoring equipment.

The electrical devices to be tested are supplied to the circuit handler at a device inlet channel of the support base. The inlet channel has an input port which receives the electrical device, and an output port for delivering the electrical device to the test site of the handler where the electrical device is stationed in a controllable environment during performance of the test procedure. Upon completion of the test procedure, the electrical device is transported to the device outlet channel which has an input port for receiving the tested electrical device and an output port via which the electrical device is expelled from the handler.

In a highly advantageous embodiment of the invention, the transport rail is sectioned so as to have an inlet rail portion, a test site rail portion, and an outlet rail portion, each of which is arranged in the vicinity of a respectively associated one of the device inlet channel, the test site, and the device outlet channel of the support base. The inlet and outlet rail portions are each provided with respective manifold portions, illustratively on the underside thereof, for conducting the pressurized air received at the third input of the support base to the juncture where the test site rail portion is met. Such manifolds may be in the form of machined depression which are closed to form conduits by the adjoining surface of the support base. The pressurized air is vented at the juncture to form the air curtain which isolates the test site from the external air portions. Thermal propagation along the transport rail is significantly reduced by the interposition of thermal barriers between the respective rail portions. The thermal barriers may be formed of an insulating material, or may be simply a gap between the rail portions.

In a highly advantageous specific illustrative embodiment of the invention, the test site rail portion of the transport rail is provided with a conditioning fluid through-channel which is coupled to the first input of the support base for conducting the conditioning fluid through the test site rail portion to the electrical device during performance of the test procedure. Such communication enables the conditioning fluid to communicate with the electrical device during the test, and thereby control the temperature thereof. In a further embodiment, the inlet rail portion is additionally provided with a pre-conditioning fluid through-channel for permitting the conditioning fluid to communicate with the electrical device prior to its being transported to the test site. This permits the electrical device to be preconditioned, thereby reducing the time required for the bringing of the electrical device to the testing temperature at the test site.

As indicated, it is desirable that the thermal mass of the handler system at the test site be minimized. This is achieved in a specific illustrative embodiment of the invention by forming the support base of a polymeric material which is a relatively poor conductor of heat. In addition, the polymeric material may be electrically conductive to facilitate dissipation of static electricity which is accumulated as the electrical device is moved along the transport rail.

In a preferred embodiment of the invention, the operation of the handler arrangement is controlled in response to pneumatic signals which are received at the second input of the support base. Thus, for example, the electrical contacts which communicate with the pins on the electrical device are moved in response to pneumatic signals, as are various stops disposed along the transport rail for controlling rail traffic. The use of pneumatic signals eliminates the stray magnetic and electrical fields which are associated with solenoid operated control elements.

The support base is provided with a channel therein, at the bottom of which is disposed the transport rail. This channel forms, in the vicinity of the test site, the interior walls of a region having a controllable environment. In the practice of the invention, the channel is provided with a cover which is installed thereover for enclosing the test site at least partially in the region where the controllable environment is contained. Preferably, the cover means is coupled to the support base by affixation pins which obviate the need for tools or other complex procedures for removal of the cover in the event of a jam-up.

In a specific embodiment, a temperature sensor is installed in the cover for monitoring the temperature of the electrical device under test. The temperature sensor is lowered by means of a pneumatic solenoid so as to communicate directly with the surface of the electrical device being tested. The operation of the pneumatic solenoid serves the further purpose of applying a force to the electrical device so that it remains stationary during the test and during the application of the electrical contacts and the conditioning fluid.

In addition to the foregoing, the cover which overlies the test site is provided with seals along its edge to prevent excessive venting of the conditioning fluid. Moreover, the cover extends along the channel to the region where the transport rail is sectioned, i.e., the junction of the inlet rail portion with the test site rail portion, and the juncture of the test site rail portion with the outlet rail portion. As previously stated, an air curtain, which is produced by the operation of a manifold system on the underside of selected portions of the transport rail, insures that the exhausted conditioning fluid does not communicate with the inlet and outlet rail portions, which are typically at ambient temperature. This air curtain, which is produced by a dried air supplied at the third input of the support base, prevents the formation of ice on the external rails.

In accordance with a method aspect of the invention, the handling of an electrical device for subjecting same to a test procedure in a controllable environment is achieved by the steps of:

first transporting the electrical device along a first section of a sectioned rail to a second section of the sectioned rail where there is arranged a test site in the controllable environment;

controlling the environment in the test site by applying an environment-modifying fluid to the electrical device through the second section of the sectioned rail;

creating a first air curtain by conducting air along an underside of the first section of the sectioned rail, the air being vented in a region intermediate of the first and second sections of the sectioned rail;

creating a second air curtain by conducting air along an underside of a third section of the sectioned rail, the air being vented in a region intermediate of the third and second sections of the sectioned rail; and second transporting the electrical device to the third section of the sectioned rail after completion of the test procedure.

In accordance with this method aspect of the invention, there is provided the further step of preconditioning the electrical device prior to performing the step of first transporting, by applying the environment-modifying fluid to the electrical device through the first section of the sectioned rail. This step, as indicated previously, reduces the time which the electrical device must spend in the test site being conditioned. Moreover, the steps of first and second transporting are performed, in certain embodiments, in response to pneumatic control signals, as is the step of monitoring directly the temperature of the electrical device during performance of the test procedure.

In accordance with a further system aspect of the invention, a rail transport system is formed of first and second rail sections, the first rail section being adapted for receiving on a top side thereof the integrated or hybrid circuit package. The underside of this first rail section is provided with a manifold along which is conducted a pressurized air to a junction between the first and second rail sections, to form an air curtain therebetween. The second rail section is provided with a further manifold on the underside thereof for conducting the environmentally-modifying fluid, and to a through-channel whereby the fluid communicates with the circuit package itself. In this manner, the electrical device is brought to the appropriate test temperature in a relatively short period of time.

BRIEF DESCRIPTION OF THE DRAWING

Comprehension of the invention is facilitated by reading the following detailed description, in conjunction with the annexed drawing, in which:

FIG. 4 is a representation of the top side of the transport rail of the present invention; and FIG. 5 is a representation of the under side of the transport rail of the present invention.

DETAILED DESCRIPTION

Figure 1:
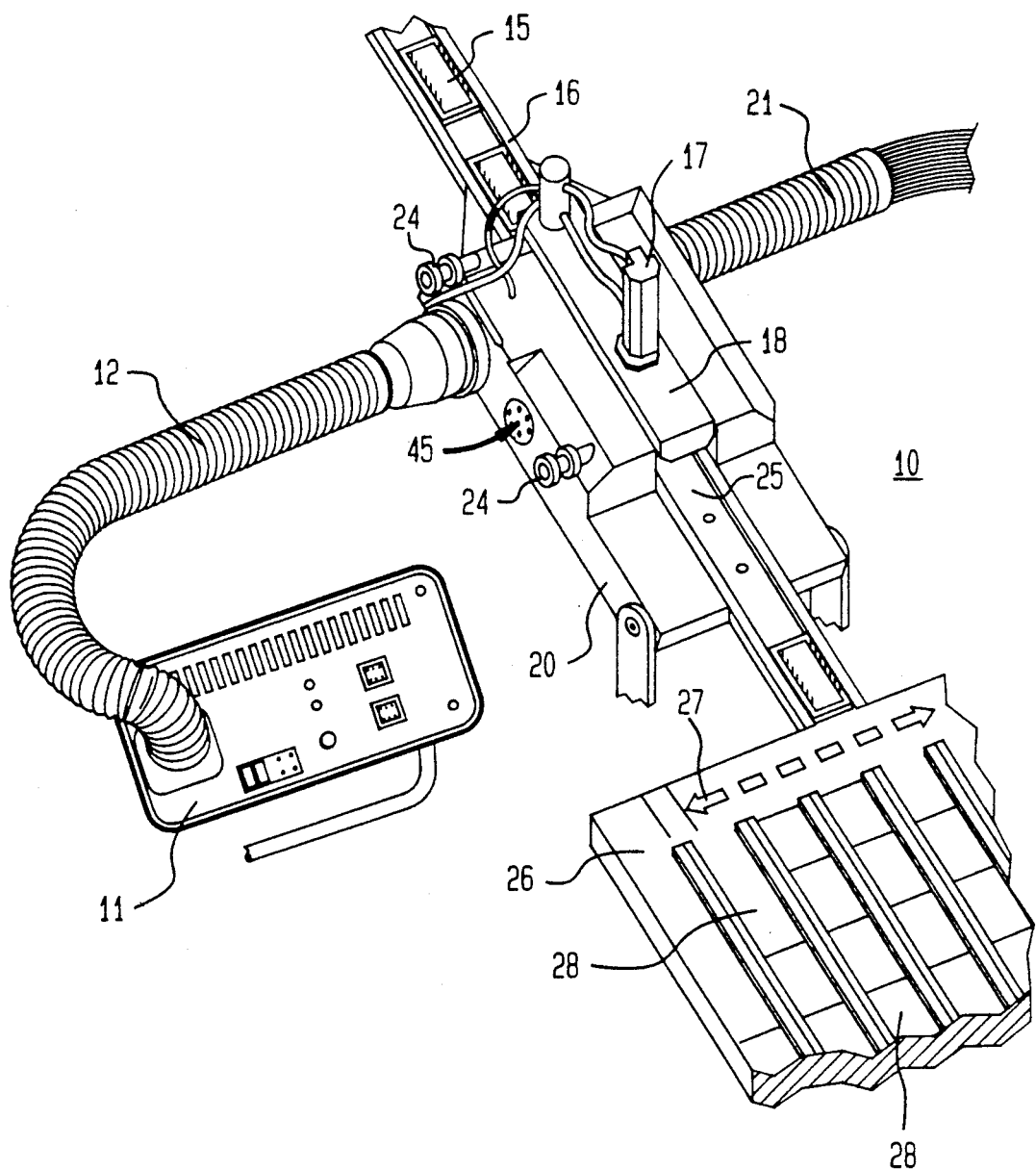
FIG. 1 is an isometric representation of a specific illustrative embodiment of the invention showing a control console and optional binning system for the tested electrical devices.

FIG. 1 is an isometric representation of an integrated circuit handler 10 which is shown, in this figure, to be coupled to a controller 11. Control 11 supplies pneumatic control signals (not shown) to handler 10 via a coupling hose 12 which may have therewithin a plurality of pneumatic signal channels (not shown).

An integrated circuit chip 15 is installed on an inlet rail 16 with the pins directed upward in this embodiment. As shown, inlet rail 16 is sloped downward whereby the integrated circuit chip is gravity fed through the system. The rails may be formed of machined aluminum, chromed aluminum, or any other suitable material.

The integrated circuit chip is conducted to a test site (not specifically shown in this figure) which is disposed directly under temperature sensor 17. The temperature sensor is installed on a test site cover 18 which, as shown, is accommodated within a channel in support block 20.

As will be described hereinbelow in greater detail, the integrated circuit chip is subjected to a predetermined procedure at the test site in a controlled environment. The environment is controlled by a conditioning fluid, which may be heated air, cooled nitrogen gas, or any other substance, which is delivered via a conditioning fluid input line 21.

In this specific embodiment of the invention, cover 18 is affixed to support block 20 by means of a pair of removable pins 24. Such pins are easily removed without requiring tools, and permit rapid correction of problems, such as jam-ups, which may occur at the test site.

Upon completion of the predetermined test, the integrated circuit chip is conducted to an outlet rail 25, which, in this embodiment, is arranged to discharge the tested integrated circuits into a binning system 26. As shown by arrows 27, the binning system is movable to permit the integrated circuit chips to be deposited in desired ones of binning slots 28.

Figure 2:
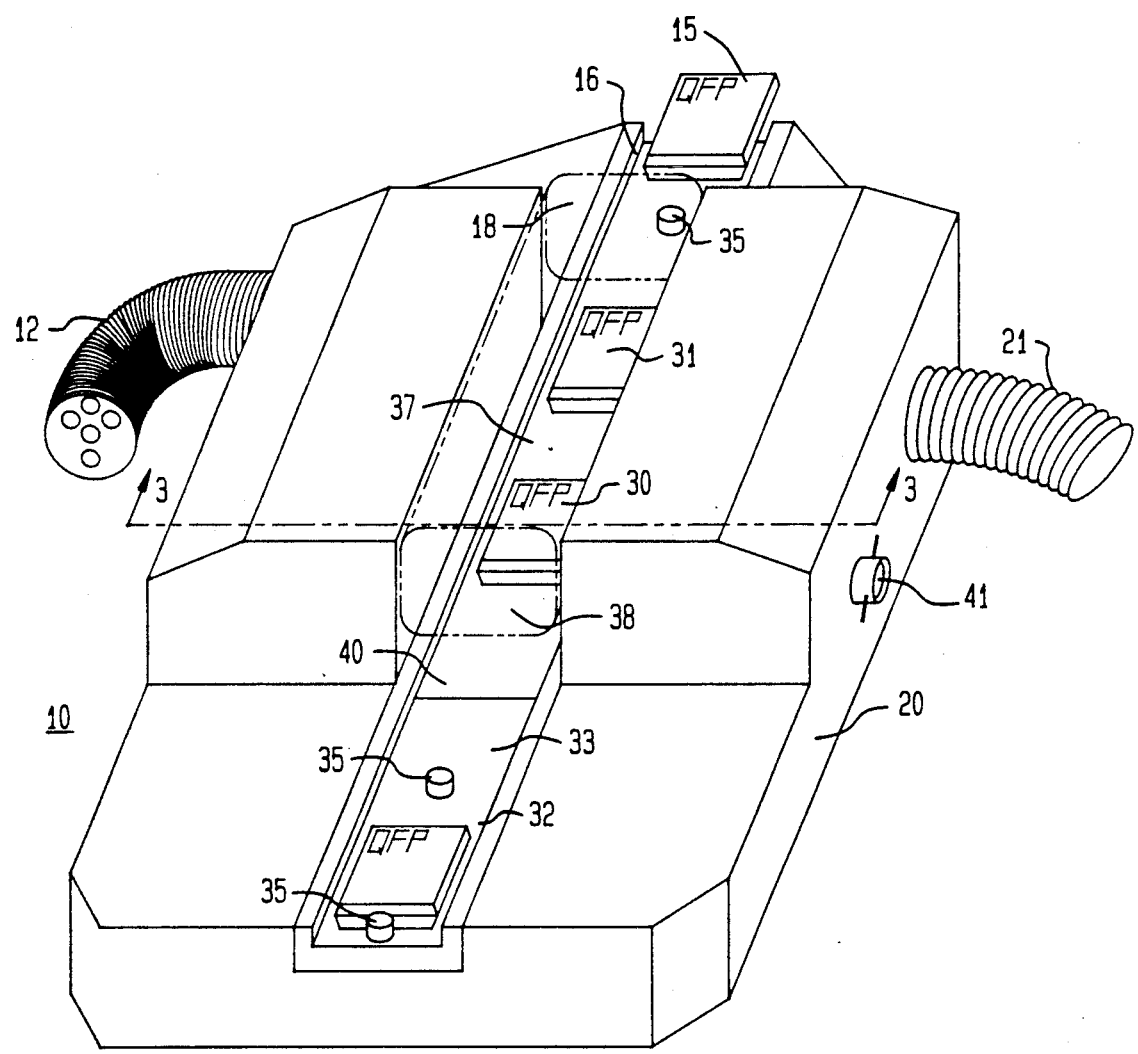
FIG. 2 is a schematic isometric representation of the handler portion.

FIG. 2 is an isometric representation of handler 10 showing a test site region 30. In addition, this figure shows a preconditioning region 31. A further integrated circuit chip is shown at discharge region 32, which is this specific embodiment, can indicate that the integrated circuit chip at discharge region 32 has performed properly during the test procedure performed at test site 30. If, for example, the integrated circuit failed to perform properly, it would have been held at a rejection region 33.

This figure shows integrated circuits at a plurality of regions along the transport rail. The rail traffic is controlled by a plurality of stops 35 which are operated in response to pneumatic signals delivered via pneumatic control line 12. Thus, integrated circuit chip 15 is loaded, in this embodiment of the invention, at inlet rail 16. Upon receipt of an appropriate pneumatic control signal, the integrated circuit chip travels to preconditioning region 31 where is to subjected to the conditioning fluid which is delivered via conditioning line 21. Preconditioning region 31 is located, in this embodiment, at a test site rail portion 37, which also contains thereon test region 30. Test region 30 also subjects the integrated circuit chip to the conditioning fluid, and is provided with electrical contacts (not shown) which enable electrical communication with the integrated circuit chip.

Cover 18 is shown in FIG. 2 to have an end portion 38 which is arranged in the vicinity of a junction 40 where the test site rail portion 37 meets outlet rail portion 32. In certain embodiments of the invention, a dried and pressurized air is vented out of junction 40 to prevent the conditioning fluid which is vented out from under end portion 38 of cover 18 to communicate with outlet rail portion 32. Thus, in the performance of cold testing procedures, which may be as low as −55° C., the air curtain at junction 40 will prevent the formation of ice on the outlet rail portion. In further embodiments, a similar air curtain is produced (not shown) at the junction between the inlet rail portion and the test site rail portion. This precludes the formation of ice on the inlet rail portion. In embodiments of the invention where the air curtain is employed, the dried pressurized air, which may be at ambient temperature, is provided at an input port 41 in support base 20. As will be described below, the pressurized air employed in the air curtain at junction 40 is provided via manifolds which are cut into the underside of the rail portions.

Figure 3:
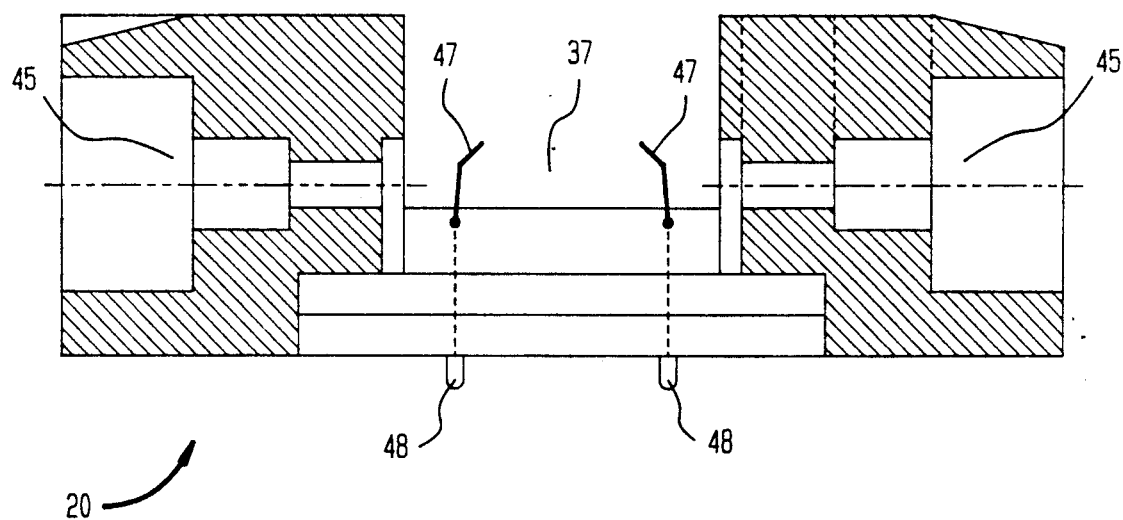
FIG. 3 is a cross-sectional representation of a specific embodiment of the invention taking substantially across the test site, as indicated by line 3—3 in FIG. 2.

FIG. 3 is a cross-sectional representation of a specific illustrative embodiment of a support base 20 taken along line 3—3 of FIG. 2. As shown in this figure, pneumatic solenoids 45 are schematically illustrated to be arranged within the support base and at considerable distance from test site 37. This ensures that the operation of the pneumatic solenoids is not adversely effected by the extreme temperature conditions of the test site. The pneumatic solenoids actuate cantilevered contacts 47 into communication with the electrical device under test (not shown in this figure). Electrical contacts 47 are coupled electrically to further contacts 48 which communicate with a test head (not shown) supplied by a user.

FIG. 4 is a top view of the sectioned transport rail, and FIG. 5 is a view of the underside of the transport rail. These figures show an inlet rail portion 50, a test site rail portion 51, and an outlet rail portion 52. The underside of inlet and outlet rail portions 50 and 52 is shown to be provided with a manifold groove 53 via which the pressurized air is conducted to form the air curtain at junction 40. In certain embodiments of the invention, a notch may be milled into the end faces of the inlet and outlet rail portions which abut junction 40, and the junction itself may be filled with a thermally insulating material to prevent the temperature extremes which are present at test site rail portion 51 from propagating to the inlet and outlet rail portions.

Test site rail portion 51 is provided with through-channel 55 at the test site. A depression 56 may be formed on the top surface of the test site rail portion in the vicinity of through-channel 55 to ensure that the conditioning fluid passing through the through-channel communicates with the entire surface of the electrical device under test. The dimensions of the depression may be configured by persons of skill in the art to accommodate specific circuit packages being tested. A further through-channel 57 is provided in the preconditioning region of the test site rail portion. As shown in FIG. 5, through-channels 55 and 57 are coupled to one another via a manifold depression 58 so that the conditioning fluid may flow through both, the test site and preconditioning through-channels. In FIG. 5, the manifold depressions 53 and 58 are closed when the transport rails are installed on the support base. The conditioning fluid is provided via channels (not shown) formed in the support base which open directly beneath manifold depressions 53 and 58. The embodiments of FIGS. 4 and 5 do not show openings for pneumatically controlled stops 35, shown in FIG. 2. However, persons of skill in the art can easily configure such through-holes.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A circuit handler system for providing a controllable environment during monitoring of an electrical device while same is subjected to a test procedure, the handler system comprising:

support base means having a first input for receiving a conditioning fluid for producing a predetermined temperature in the controllable environment, a second input for receiving control signals, a third input for receiving pressurized air, and a test output for producing signals responsive to the electrical device while it is under test, said support base means being further provided with a device inlet channel disposed in a top surface of said support base means and arranged to have an inlet channel input port for receiving the electrical device and an inlet channel output port for delivering the electrical device to a test site arranged in said top surface of said support base means where the electrical device is stationed in the controllable environment during performance of the test procedure, there being further provided in said top surface of said base support means a device outlet channel having an outlet channel input port for receiving the electrical device from said test site, and an outlet channel output port for expelling the electrical device from said support base means upon completion of the test procedure;

rail means arranged on said top surface of said support base means for accommodating on an upward facing first side thereof the electrical device at said test site during performance of said test procedure and during transportation of the electrical device to and from said test site, said rail means being formed of an inlet rail portion, a test site rail portion, and an outlet rail portion, said portions being arranged sequentially with respect to one another and each such portion being arranged in the vicinity of a respective one of said device inlet channel, said test site, and said device outlet channel, said inlet and outlet rail portions of said rail means each being provided with a respective manifold portion on a second side of said rail means which faces said support base means for conducting therealong said pressurized air received at said third input of said support base means to be released at an associated juncture of said test site rail portion for producing an air curtain at each such juncture; and thermal barrier means interposed between said inlet, test site, and outlet rail portions for reducing thermal conductance between said test site and inlet rail portions and said test site and outlet rail portions.

2. The circuit handling system of claim 1 wherein said test site rail portion is provided with a conditioning fluid through-channel coupled to said first input of said support base means for conducting said conditioning fluid through said test site rail portion to the electrical device during performance of the test procedure.

3. The circuit handling system of claim 1 wherein said inlet rail portion is provided with a preconditioning fluid through channel coupled to said first input of said support base means for conducting said conditioning fluid through said inlet rail portion to the electrical device for preconditioning the electrical device prior to performing the test procedure.

4. The circuit handling system of claim 1 wherein said support base means is formed of a polymeric material.

5. The circuit handling system of claim 4 wherein said polymeric material is electrically conductive for dissipating static electricity.

6. The circuit handling system of claim 1 wherein there is further provided electrical contact means for communicating electrically with the electrical device, said electrical contact means being coupled electrically with said test output of said support base means.

7. The circuit handling system of claim 6 wherein said electrical contact means have a first position for communicating electrically with the electrical device, and a second position wherein said electrical contact means is disengaged from the electrical device, said electrical contact means being movable between said first and second positions in response to control signals received at said second input of said support base means.

8. The circuit handling system of claim 7 wherein said control signals are pneumatic control signals.

9. The circuit handling system of claim 1 wherein there is further provided:

cover means for installation on said support base means in the vicinity of said test site, for enclosing said test site at least partially whereby the controllable environment is contained therewithin; and coupling means for affixing said cover means to said support base means.

10. The circuit handling system of claim 9 wherein there are further provided:

temperature sensor means installed on said cover means in the vicinity of said test site for providing a signal responsive to temperature; and sensor actuator means for moving said temperature sensor means into communication with the electrical device for enabling measurement of a temperature directly on the electrical device.

11. The circuit handling system of claim 10 wherein said sensor actuator means further operates to hold the electrical device in place during performance of the test procedure.

12. The circuit handling system of claim 9 wherein said cover means is arranged to direct an exhaust of said conditioning fluid in said test site to the vicinity of said air curtain, whereby said exhaust of said conditioning fluid is directed by said air curtain away from said inlet and outlet rail portions.

13. The circuit handling system of claim 1 wherein there are further provided a plurality of stop members arranged in said rail means for controlling traffic flow of a plurality of electrical devices upon which are to be performed the test procedure.

14. The circuit handling system of claim 13 wherein said stop members are actuatable in response to said control signals received at said second input of said support base means.

15. The circuit handling system of claim 13 wherein said rail means is angulated whereby the electronic device travels along said rail means in response to the force of gravity.

* * * * *